(12) United States Patent
Chen

(10) Patent No.: US 8,878,222 B2
(45) Date of Patent: Nov. 4, 2014

(54) LIGHT EMITTING DIODE WITH A TEMPERATURE DETECTING PATTERN AND MANUFACTURING METHOD THEREOF

(75) Inventor: Chen-Yu Chen, Changhua County (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 311 days.

(21) Appl. No.: 13/419,490

(22) Filed: Mar. 14, 2012

(65) Prior Publication Data

US 2012/0168813 A1 Jul. 5, 2012

Related U.S. Application Data

(63) Continuation of application No. 12/564,373, filed on Sep. 22, 2009, now Pat. No. 8,169,046.

(30) Foreign Application Priority Data

Feb. 18, 2009 (CN) .......................... 2009 1 0037331

(51) Int. Cl.
*H01L 33/62* (2010.01)
*H01L 27/15* (2006.01)
*G01K 13/10* (2006.01)
*G01K 7/18* (2006.01)
*H01L 33/64* (2010.01)

(52) U.S. Cl.
CPC ................. *H01L 27/15* (2013.01); *G01K 13/10* (2013.01); *G01K 7/183* (2013.01); *H01L 33/64* (2013.01)
USPC ............... 257/99; 257/467; 257/88; 257/459; 257/E33.067; 257/E33.055

(58) Field of Classification Search
CPC .......... H01L 33/08; H01L 33/52; H01L 27/16
USPC ....... 257/99, E33.055, 467, 88, E33.067, 459
See application file for complete search history.

(56) References Cited

U.S. PATENT DOCUMENTS

2010/0133559 A1* 6/2010 Morimoto ........................ 257/88
2012/0049214 A1* 3/2012 Lowes et al. ..................... 257/89

* cited by examiner

*Primary Examiner* — Cathy N Lam
(74) *Attorney, Agent, or Firm* — Li & Cai Intellectual Property (USA) Office

(57) ABSTRACT

A light emitting diode (LED) includes a substrate, a temperature detecting pattern, and a semiconductor structure. The temperature detecting pattern is formed on the substrate. Then the semiconductor structure is formed on the temperature detecting pattern and the substrate. The semiconductor structure includes an n-type semiconductor layer, a p-type semiconductor layer, and an active layer. Per above-mentioned structural design, the temperature detecting pattern directly integrated into the LED can measure the actual temperature of PN junction with high precision.

20 Claims, 6 Drawing Sheets

LIGHT EMITTING DIODE WITH A TEMPERATURE DETECTING PATTERN AND MANUFACTURING METHOD THEREOF

CROSS REFERENCE TO RELATED APPLICATION

This application is a Continuation of co-pending application Ser. No. 12/564,373, filed on Sep. 22, 2009, the entire contents of which are hereby incorporated by reference and for which priority is claimed under 35 U.S.C. §120.

BACKGROUND OF THE INVENTION

1. Field of the Invention

The present invention relates to a light emitting diode with a temperature detecting pattern and a manufacturing method thereof, in particular to a light emitting diode which is integral with a temperature detecting pattern.

2. Description of Related Art

Progressively, electronic devices are becoming smaller in size and lighter in weight depending on the capability of the semiconductor manufacturing processes. Therefore, the electronic device has an increasing heat density thereon. For the reason of preventing the device from failure, the heat-dissipation of the electronic package has to be analyzed. The real thermal resistance of the device is calculated by correcting and measuring voltage drop in a manner of thermal sensitive principle.

In LED application, the thermal resistance is defined as the ratio of the temperature difference on the conductive path and the total consumed power; and the thermal resistance is used to represent the heat-dissipation of the light emitting device. Traditionally, an exterior tool is used to measure the temperature difference.

Besides the aforementioned way, there is prior art which discloses having a light emitting diode and an exterior temperature sensor being integrally packaged in a light emitting device as shown as in US publication NO. 2006/0239314. The diode and sensor are electrically bonding by wires. However, the measured temperature of the temperature sensor can not represent the PN junction temperature precisely because of the fact that the temperature sensor has a longer distance to the PN junction. The imprecise temperature is alternatively resulted from the different thermal paths due to the variation of the curing process of die bonding glue, or the material variation of the die bonding glue. In other words, the temperature measured by the temperature sensor can not be referred to as the precise temperature of the PN junction of diode.

Another traditional method is used for measuring the temperature of the diode by IR detection. However, for this particular method, the IR detection is only applied for measuring the temperature of a diode which has not been packaged. In other words, it is not suitable to measure the temperature by IR detection in general production application.

Therefore, in view of this, the inventor proposes the present invention to overcome the above problems based on his expert experience and deliberate research.

SUMMARY OF THE INVENTION

The primary object of the present invention is to provide for a light emitting diode having a temperature detecting pattern therein. Therefore, the temperature detecting pattern can provide the actual and precise temperature of the diode (i.e., the temperature of PN junction of the diode) and the temperature detecting pattern can be applied for detecting a temperature immediately while the diode is in working state.

To achieve the above-mentioned objective, the present invention provides a light emitting diode with a temperature detecting pattern. The light emitting diode includes a substrate, a semiconductor structure formed on the substrate, an insulating layer formed adjacent to the semiconductor structure; and a temperature detecting pattern formed adjacent to the insulating layer.

The present invention further provides a manufacturing method of the light emitting diode with the temperature detecting pattern.

The temperature detecting pattern is integral with the light emitting diode. In other words, the light emitting diode has the temperature detecting pattern built-in with the diode. Therefore, user can know the temperature of the PN junction precisely and in real-time. Therefore, the temperature can be used to calculate the thermal resistance. In other words, the temperature is directly measured by the temperature detecting pattern, and not calculated by the traditional method. Thus, the precise temperature can be used to calculate the thermal resistance in high precision.

In order to further understand the techniques, means, and effects, the present invention takes for achieving the prescribed objectives, the following detailed descriptions and appended drawings are hereby referred; such that, through which the purposes, features, and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 1:
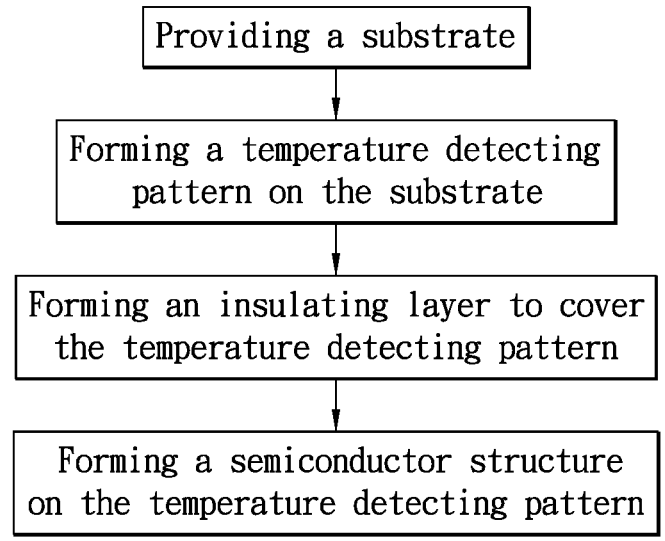
FIG. 1 is a flow chart showing a manufacturing method of a light emitting diode with a temperature detecting pattern according to the present invention.
Figure 1A:
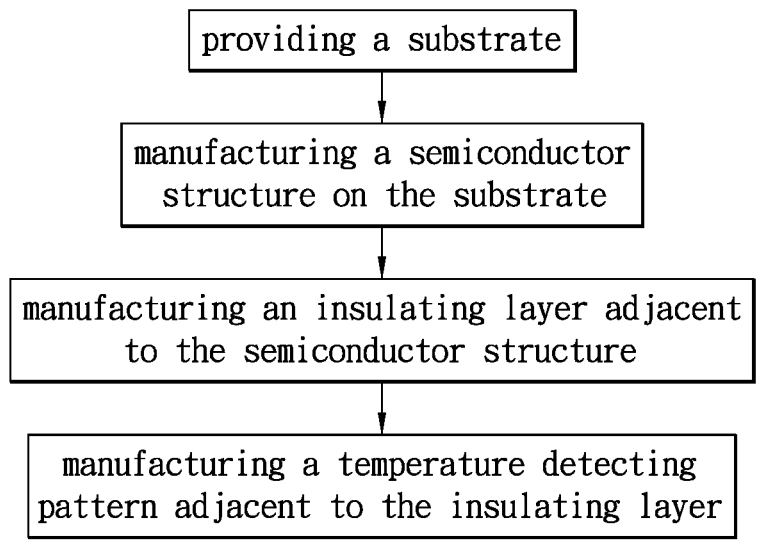
FIG. 1A is a flow chart showing a manufacturing method of a light emitting diode with a temperature detecting pattern according to the present invention.
Figure 4:
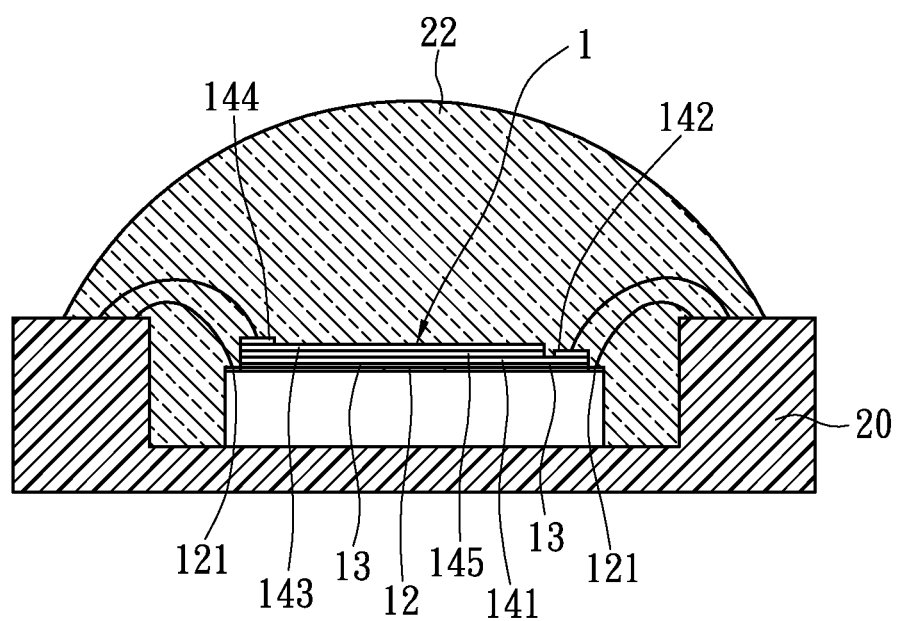
FIG. 4 shows that the light emitting diode that has been packaged according to the present invention.

Please refer to FIGS. 1, 1A and 4; the present invention provides a light emitting diode 1 which has a temperature detecting pattern as a circuit inside the light emitting diode 1. In other words, the diode structure is integrated with a thermal sensor so that the light emitting diode 1 can detect the actual temperature of itself. Furthermore, the problem of non real-time detection and non precise detecting result obtained by an exterior sensor system is solved.

Figure 2:
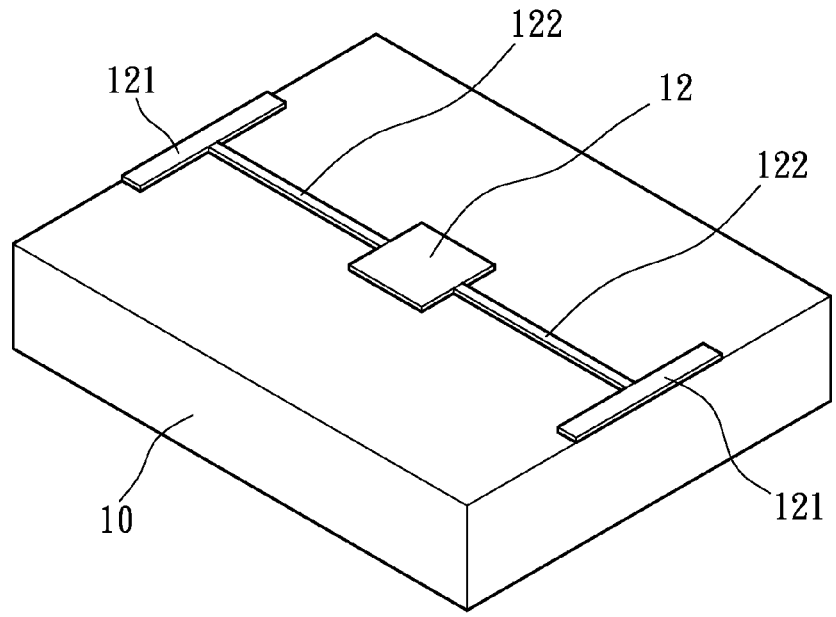
FIG. 2 shows the temperature detecting pattern being disposed on a substrate according to the present invention.
Figure 3:
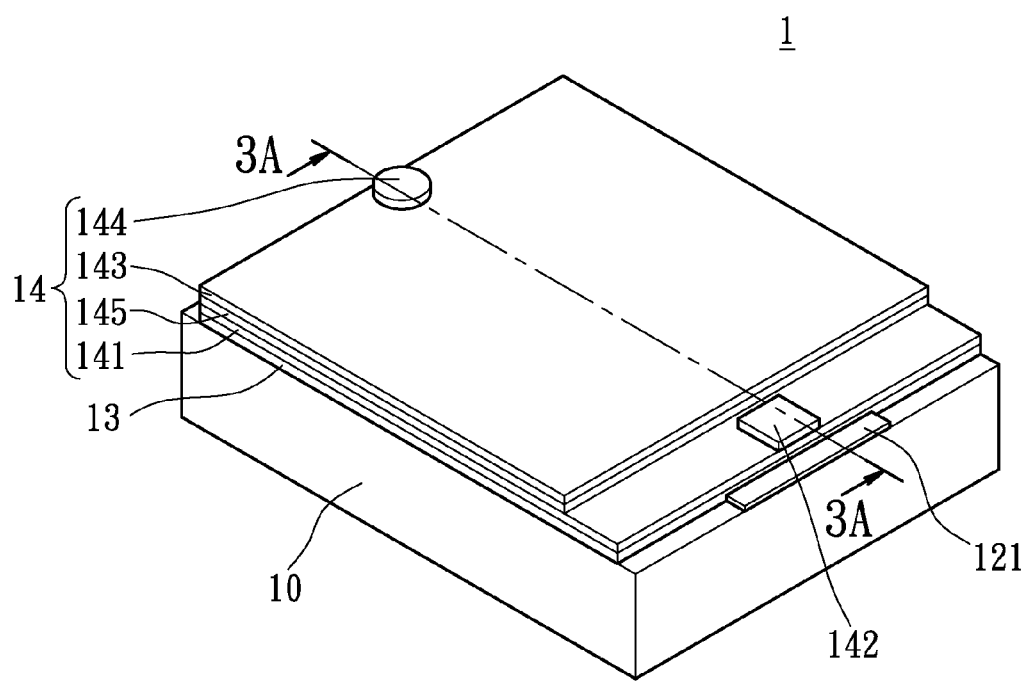
FIG. 3 shows the first embodiment of the light emitting diode according to the present invention.
Figure 3A:
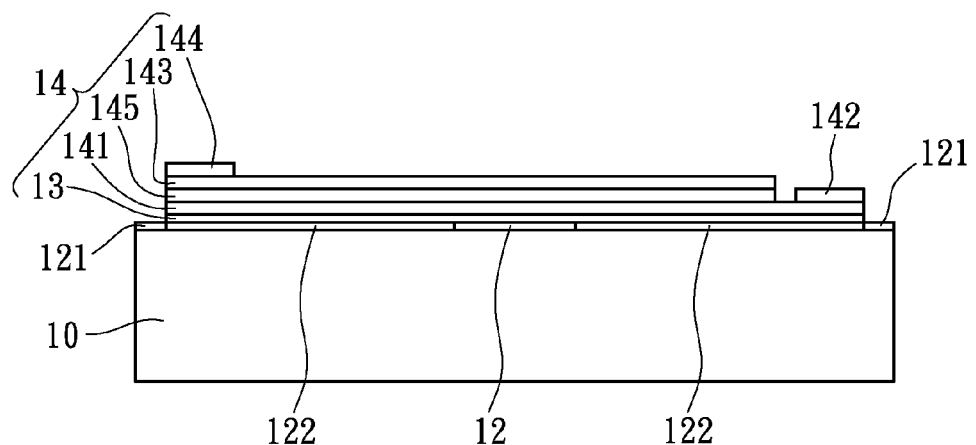
FIG. 3A is a cross-sectional view along with 3A-3A on FIG. 3.

FIGS. 2 and 3 show the first embodiment of the present invention and a horizontal type light emitting diode 1 is shown. The light emitting diode 1 includes a substrate 10, a temperature detecting pattern 12, and a semiconductor structure 14. In the embodiment, the substrate 10 is a substrate of light emitting diode and it is a non-conductive substrate and the semiconductor structure 14 is a multilayer stacked structure with light emitting function.

Figure 3B:
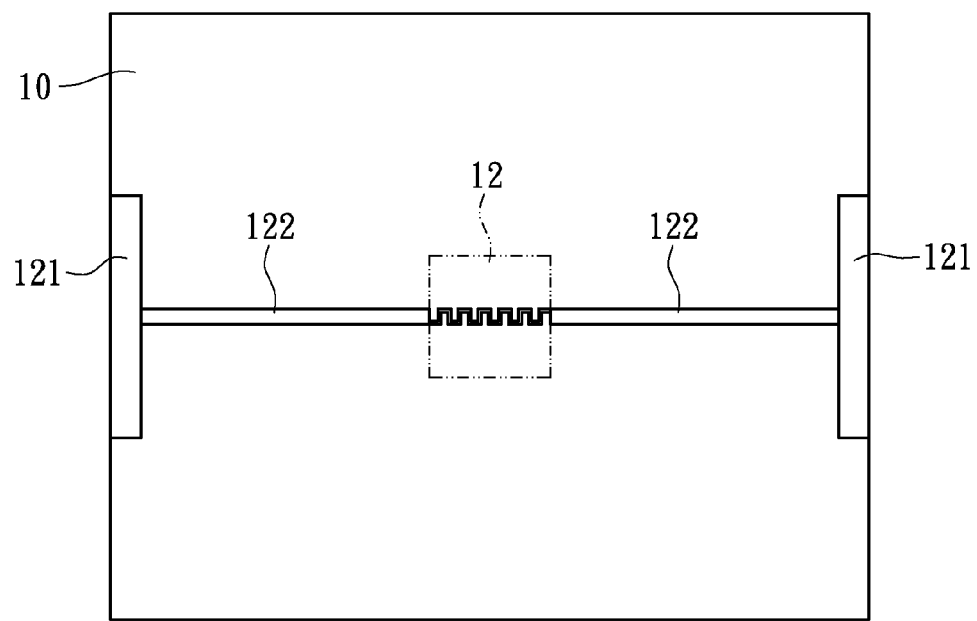
FIG. 3B shows the temperature detecting pattern with serpentine detecting line according to the present invention.

The temperature detecting pattern 12 is formed on the substrate 10. In the present embodiment, the temperature detecting pattern 12 is directly formed on the substrate 10 via a depositing method, such as PVD (Physical Vapor Deposition), CVD (Chemical Vapor Deposition) and/or another semiconductor process, especially on photolithography. Then, the semiconductor structure 14 is formed, wherein the formation may be via the epitaxial method. For example, the evaporated or reacted molecule reaches the substrate 10 in an extremely high rate in super vacuum chamber. Moreover, the composition, thickness, and amount of layers of the heterostructure in nano size are precisely controlled so that the semiconductor structure 14 is formed. Accordingly, the light emitting diode 1 has the temperature detecting pattern 12 thereinside. On the other hand, the semiconductor structure 14, for example a multilayer stacked structure, includes an n-type semiconductor layer 141, p-type semiconductor layer 143, and an active layer 145 formed between the n-type semiconductor layer 141 and the p-type semiconductor layer 143. The n-type semiconductor layer 141 further has an n-contact electrode 142 on the top thereof, the p-type semiconductor layer 143 has a p-contact electrode 144 on the top thereof, and the active layer is a multi-quantum well (MQW) structure for lighting. Except that, the temperature detecting pattern 12 may be formed on a side of the semiconductor structure 14. In other words, the temperature detecting pattern 12 is formed integrally with the substrate 10 and the semiconductor structure 14 by the epitaxial method so that the temperature detecting pattern 12 can be used for directly detecting the temperature of the semiconductor structure 14 (i.e., the temperature of the light-generation). Thus, an exterior electronic unit having temperature-control function can output signal to control heat-dissipating devices according to the real and precise junction temperature (i.e., the temperature of the light-generation) which is detected by the temperature detecting pattern 12. There are two detecting electrodes 121 formed on the two sides of the substrate 10, and the temperature detecting pattern 12 electrically connects to the two detecting electrodes 121 respectively via a connection line 122. The detecting electrodes 121 are at least partly exposed from the semiconductor structure 14. The two detecting electrodes 121 output the real and precise temperature value to the electronic unit. The temperature detecting pattern 12 can be formed with a serpentine detecting line, a waveform detecting line or a zigzag detecting line which can be used for improving the sensitivity of temperature detection, as shown in FIG. 3B.

The main function of the semiconductor structure 14 is for emitting light. In other words, the semiconductor structure 14 can be excited by voltage for generating light. The temperature detecting pattern 12 of the present invention can detect the PN junction temperature (i.e., the temperature of the light-generation) in the position adjacent to the PN junction of the semiconductor structure 14. The semiconductor structure 14 includes an n-type semiconductor layer 141 with an anode (i.e., the n-contact electrode 142) and a p-type semiconductor layer 145 with a cathode (i.e., the p-contact electrode 144), wherein the cathode and the anode are connected to a power supply for exciting the semiconductor structure 14.

Furthermore, an insulating layer 13 is located between the temperature detecting pattern 12 and semiconductor structure 14 for electrically isolated each other. In addition, the existence of the temperature detecting pattern 12 may result in the increase of defects of the semiconductor structure 14 or non-uniformity of emitting light. Thus, the insulating layer 13 may be not only located on the temperature detecting pattern 12 but also be provided between the substrate 10 and the semiconductor structure 14. In the present embodiment, the insulating layer 13 has an approximate planar upper surface for forming the semiconductor structure 14 with more perfect crystalline. Moreover, the light emitting diode 1 has improved structure strength depending on the insulating layer 13. The composition of the insulating layer 13 can be adjustable, for example, the insulating layer 13 can be a ZrN layer, an AlN layer, or a ZrN/AlN layer. The abovementioned structure composed of the temperature detecting pattern 12 and the insulating layer 13 can provide a smooth upper surface so that the semiconductor structure 14 formed on the insulating layer 13 has improved structure.

Thus, the light emitting diode 1 with the temperature detecting pattern 12 including a substrate 10, the semiconductor structure 14 formed on the substrate 10, the insulating layer 13 formed adjacent to the semiconductor structure 14; and the temperature detecting pattern 12 formed adjacent to the insulating layer 13 is provided.

According to the embodiment about the horizontal type light emitting diode 1 with a temperature detecting pattern 12 as a circuit, the manufacturing method has the following steps.

Step (a) is providing a substrate 10. For example, the substrate 10 is made of sapphire material and the substrate 10 further has a buffer layer thereon so as to stack the materials formed on the substrate 10.

Step (b) is manufacturing a temperature detecting pattern 12 on the substrate 10. When the substrate 10 is a conductive material, a non-conductive layer is first provided on the substrate 10 before the step of forming the temperature detecting pattern 12 so that the temperature detecting pattern 12 is insulated from the substrate 10. Moreover, when the substrate 10 is silicon, temperature detecting pattern 12 may be formed/defined on the substrate 10 by doping process.

In the present embodiment, the temperature detecting pattern 12 is a resistance temperature detector (RTD) and the temperature detecting pattern 12 is constructed by a metal thin film. The resistance of the temperature detecting pattern 12 is changed depending on the temperature so that the temperature of PN junction of the light emitting diode 1 can be detected via the temperature detecting pattern 12. The detail steps provided for manufacturing the RTD is as follow. First step is forming an AlN layer on the substrate 10. Then, a Cr layer or a Ni layer and an Au layer are provided on the AlN layer by an evaporating deposition method. In other words, either a Cr layer and an Au layer are provided on the AlN layer or a Ni layer and an Au layer are provided on the AlN layer by the evaporating deposition method. Next step is a lithography process and then the Cr layer or the Ni layer and the Au layer are etched. The last step is depositing another AlN layer for covering the etched Cr layer or the Ni layer and the Au layer so as to form the RTD on the substrate 10. Except that, the lithography and etching processes are further provided for forming the connection lines 122 and the two detecting electrodes 121 on the two sides of the substrate 10. In the present embodiment, the metal thin film of the Ni layer and/or the Au layer with thickness of 0.2 μm is preferred, and the metal thin film is patterned for construction as the temperature detecting pattern 12. In the present embodiment, the step of patterning the metal thin film means the forming of a serpentine detecting line, a waveform detecting line or a zigzag detecting line of the metal thin film. Moreover, the width of the detecting line of the temperature detecting pattern 12 is smaller than the width of the connection lines 122 so as to increase the detection precision of the temperature detecting pattern 12. The above-mentioned processes of the temperature detecting pattern 12 are merely an example, but the present invention is not restricted thereby.

Step (c) is providing an insulating layer 13 located on the temperature detecting pattern 12. The insulating layer 13 is used for electrically insulating the temperature detecting pattern 12 and the semiconductor structure 14. Furthermore, the insulating layer 13 is also used for leveling the unevenness or the concave bumps of the structure so as to form an approximate planar surface. Thus, the semiconductor structure 14 can be perfectly formed on the smooth upper surface of the insulating layer 13. In the present embodiment, the thickness of an AlN layer provided as the insulating layer 13 is 0.35 μm preferably and the width of the insulating layer 13 is smaller than the width defined by the temperature detecting pattern 12, the connection lines 122 and the two detecting electrodes 121 so as to expose the two detecting electrodes 121 on the side of the substrate 10. Therefore, the two detecting electrodes 121 can connect and transmit the temperature detected signal to the electronic unit (i.e., a detecting system exterior to the light emitting diode 1). The following two methods are provided for forming the insulating layer 13. In one method, a mask is used for covering the two detecting electrodes 121 and the insulating layer 13 is formed on the abovementioned structure including the temperature detecting pattern 12, the two detecting electrodes 121, connection lines, and substrate 10. Then, remove the mask, the two detecting electrodes 121 are exposed without covering insulating layer. In the other method, the insulating layer 13 is formed on the temperature detecting pattern 12, the two detecting electrodes 121, connection lines 122, and substrate 10 and then lithography and etching processes are used for defining spaces to expose the two detecting electrodes 121. In addition, it may introduce a planarization process such as CMP, photolithography and so on for providing an approximate planar surface of the insulating layer.

Step (d) is manufacturing a semiconductor structure 14. In the present embodiment, the semiconductor structure 14 is formed on the approximate planar upper surface of the insulating layer 13, and the semiconductor structure 14 includes an n-type semiconductor layer 141, a p-type semiconductor layer 143, and an active layer 145 between the n-type semiconductor layer 141 and the p-type semiconductor layer 143. The semiconductor structure 14 further includes an n-contact electrode 142 and a p-contact electrode 144. The PN junction of the above-mentioned structure can emit light when it is excited by voltage. Moreover, before forming the n-contact electrode 142 and the p-contact electrode 144, a photolithography process is provided for exposing a portion of the n-type semiconductor layer 141 and further provided to expose the two detecting electrodes 121. The n-contact electrode 142 and the p-contact electrode 144 can be formed respectively on the n-type semiconductor layer 141 and the p-type semiconductor layer 143 in the same step so that the n-contact electrode 142 and the p-contact electrode 144 can connect to the power supply. The above-mentioned processes can be adjustable depending on the practical situation.

In addition, the two detecting electrodes 121 also can be formed as the same step of forming the n-contact electrode 142 and the p-contact electrode 144. In the other word, the manufacture of a temperature detecting pattern 12 only defines the temperature detecting pattern 12 and connecting lines 122. Before forming the n-contact electrode 142 and the p-contact electrode 144 of the manufacture of a semiconductor structure 14, a photolithography step is provided for exposing a portion of the n-type semiconductor layer 141 and a predetermined portion of substrate 10 which the two detecting electrodes 121 can form on. Thus, the n-contact electrode 142, the p-contact electrode 144, and the two detecting electrodes 121 can be formed respectively on the n-type semiconductor layer 141, the p-type semiconductor layer 143, and on the substrate 10, wherein the two detecting electrodes 121 connect the temperature detecting pattern 12 via the connecting lines 122. Furthermore, the portion of connection lines 122 may extend to the predetermined portion of substrate 10 to enhance the connection between the two detecting electrodes 12 and thereof.

In addition, exposing the detecting electrodes 121 after forming the insulating layer 13 is an optional process. It means that the process of exposing the detecting electrodes 121 can be combined into the manufacture of semiconductor structure 14. For example, the step of removing the mask covering the two detecting electrodes 121 or the predetermined portion of the substrate 10 is provided after the n-type semiconductor layer 141, the active layer 145, and the p-type semiconductor layer 143 are formed. Alternatively the photolithography step provided for exposing a portion of the n-type semiconductor layer 141 and further provided to expose the two detecting electrodes 121 on the predetermined portion of the substrate 10 includes a step of etching insulating layer 13.

Accordingly, the light emitting diode 1 with a function of temperature detection is manufactured. In other words, the light emitting diode 1 has a temperature detecting pattern 12 which is applied for detecting the temperature of PN junction. The temperature detecting pattern 12 is provided much closer to the PN junction of the semiconductor structure 14 so that the temperature detecting pattern 12 can detect the real temperature of light-generation with high precision and stability. Moreover, the semiconductor structure 14 and the temperature detecting pattern 12 are formed on different planes. In the present embodiment, the temperature detecting pattern 12 is located below the semiconductor structure 14 so that the light-emitting area of the semiconductor structure 14 is not influenced by the temperature detecting pattern 12. In other words, the position and existence of the temperature detecting pattern 12 does not influence the light-emitting area and the light-emitting efficiency of the semiconductor structure 14.

The light emitting diode 1 with the temperature detecting pattern 12 can be packaged as a light emitting device as shown in FIG. 4. The light emitting diode 1 is mounted on and received in a package structure 20 and an encapsulating material 22 is provided for covering the light emitting diode 1 so as to protect the light emitting diode 1 and achieve optical effects. In practice, the package structure 20 includes a first conductive structure and a second conductive structure (not shown), wherein each conductive structure has at least two conductive units as positive electrode or negative electrode. The re-contact electrode 142 and the p-contact electrode 144 of the semiconductor structure 14 are respectively electrically connected to a cathode and an anode of the power supply via the first conductive structure of the package structure 20 and conductive wires (i.e., first conductive wires). The two detecting electrodes 121 which connect the temperature detecting pattern 12 are connected to the electronic device via the second conductive structure of the package structure 20 and other conductive wires (i.e., second conductive wires). The first conductive wires are independent to the second conductive wires so that the power signal of n-contact electrode 142 and the p-contact electrode 144 are independent to the temperature signal of the two detecting electrodes 121. Please note that the first conductive wires and the second conductive wires are respectively connected to the package structure 20 in FIG. 4, but it is simply an illustrated drawing. Therefore, the temperature detecting pattern 12 can detect the real temperature of PN junction when the light emitting diode 1 is emitting light.

Moreover, the distance of the temperature detecting pattern 12 and the mounting surface of the package structure 2 is smaller than the distance of the active layer 145 of the semiconductor structure 14 and the mounting surface of the package structure 2. In other words, the temperature detecting pattern 12 is located below the semiconductor structure 14 (i.e., the active layer 145) so that the light-emitting area of the semiconductor structure 14 is not influenced by the temperature detecting pattern 12. Therefore, the position and existence of the temperature detecting pattern 12 does not influence the light-emitting area, emitted light intensity and the light-emitting efficiency of the semiconductor structure 14.

In the other word, the manufacturing method of the light emitting diode 1 with the temperature detecting pattern 12 has steps as the follows: providing the substrate 10, manufacturing the semiconductor structure 14 on substrate 10, manufacturing the insulating layer 13 adjacent to the semiconductor structure 14, and manufacturing the temperature detecting pattern 12 adjacent to the insulating layer 13.

Figure 5:
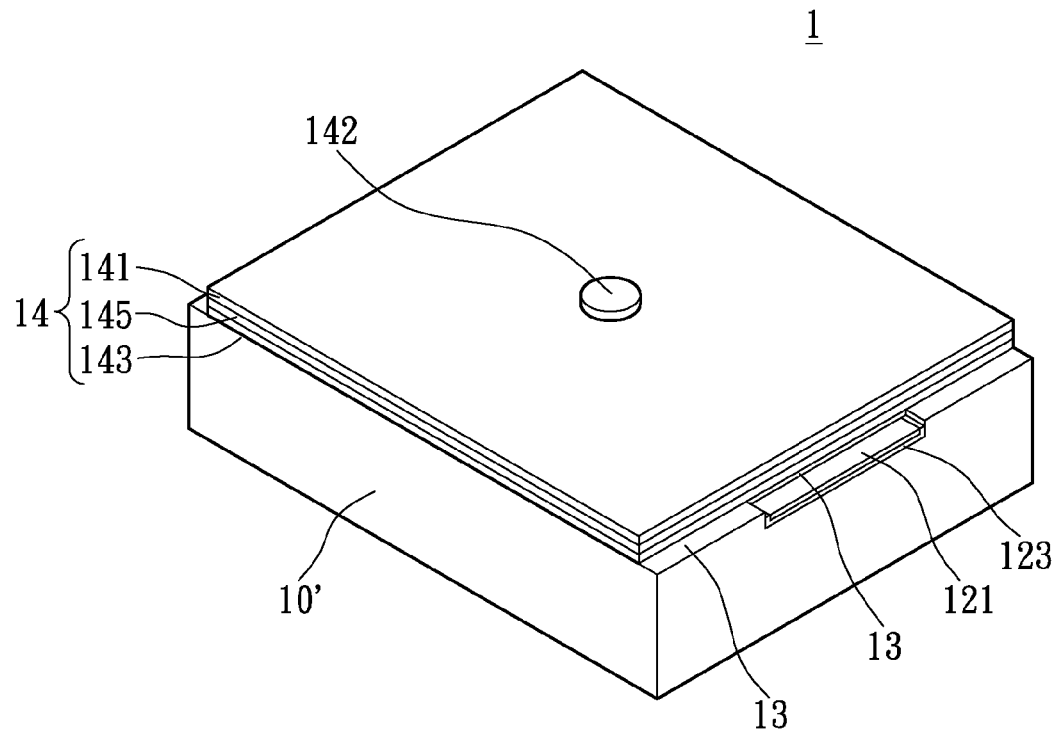
FIG. 5 shows the second embodiment of the light emitting diode according to the present invention.
Figure 6:
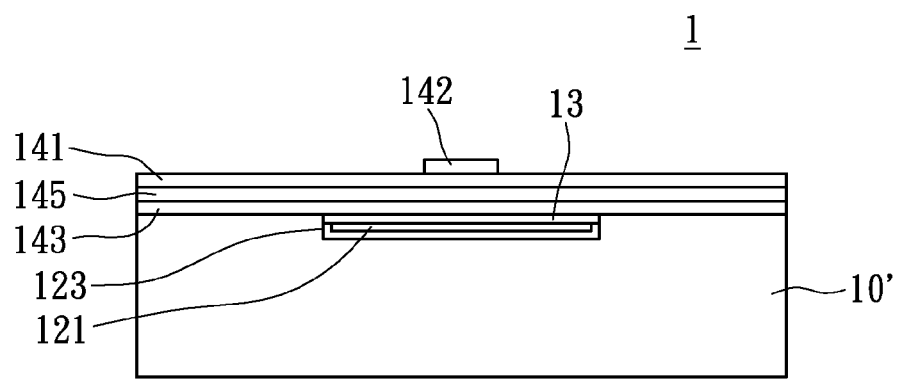
FIG. 6 is a cross-sectional view of FIG. 5A.

Please refer to FIGS. 5 and 6; which show the second embodiment of the vertical type light emitting diode 1 with the temperature detecting pattern 12 as a circuit of the present invention. The vertical light emitting diode 1 is manufactured by the following steps. Step 1 is providing a substrate 10. Step 2 is manufacturing a semiconductor structure 14 on the substrate 10. In step 2, an n-type semiconductor layer 141, an active layer 145, and a p-type semiconductor layer 143 are formed on the substrate 10. Then, step 3 is forming a temperature detecting pattern 12 and a first electrode (i.e., the p-contact electrode 144 of the first embodiment) on the semiconductor structure 14. The first electrode is formed on or mounted on the p-type semiconductor layer 143 of the semiconductor structure 14, and the temperature detecting pattern 12 is formed inside the first electrode. Furthermore, a step of forming an auxiliary insulating layer 123 located between the temperature detecting pattern 12 and the first electrode is provided. On the other hand, a step of removing the substrate 10 is provided after the step of forming the first electrode and then the structure without substrate 10 is flipped up side down (i.e., the structure is reversed). Next step is forming a second electrode (i.e., the n-contact electrode 142 of the first embodiment) on a surface of the semiconductor structure 14 and the surface is exposed after the step of removing the substrate 10. In other words, the second electrode is formed on the exposed surface after the substrate 10 is removed.

Moreover, please refer the processes of the first embodiment, the temperature detecting pattern 12, connection lines 122 and the two detecting electrodes 121 are defined by a photolithography method. The metal thin film (for example, Au layer or Ni layer) is patterned form as a serpentine detecting line, a waveform detecting line or a zigzag detecting line as the temperature detecting pattern 12. Similarly with the first embodiment, an insulating layer 13 is formed adjacent to the semiconductor structure, and the temperature detecting pattern 12 is formed adjacent to the insulating layer 13. In other words, the insulating layer 13 provided between the abovementioned structure (such as temperature detecting pattern 12, connection lines 122 and the two detecting electrodes 121) and the semiconductor structure 14, so that the temperature detecting pattern 12 is insulated from the semiconductor structure 14.

In addition, the detecting electrodes 121 exposed also can be following the steps. For example, further providing a mask or photoresist on the predetermined portion of the insulating layer 13 which the two detecting electrodes 121 will be formed on. And following the same steps of present embodiment, the temperature detecting pattern 12, connection lines 122, and the two detecting electrodes 121 are formed on the abovementioned structure. Next step is forming or mounting the first electrode on the p-type semiconductor layer 143 of the semiconductor structure 14. Then, the two detecting electrodes 121 will be exposed in the same step of removing the substrate 10 or an extra lift-off step.

Similar to the first embodiment, the two detecting electrodes 121 also can be formed as the same step of forming the n-contact electrode 142. In the other word, the manufacture of a temperature detecting pattern 12 only defines the temperature detecting pattern 12 and connecting lines 122. Before forming the n-contact electrode 142 of the manufacture of a semiconductor structure 14, a photolithography step is provided for etching the n-type semiconductor layer 141, the active layer 145, the p-type semiconductor layer 143 and the insulating layer 13 sequentially and then exposing a predetermined portion of the auxiliary insulating 123 of the substrate 10' which the two detecting electrodes 121 can form on. Thus, the n-contact electrode 142, and the two detecting electrodes 121 can be formed respectively on the n-type semiconductor layer 141, and on the auxiliary insulating 123 of the substrate 10', wherein the two detecting electrodes 121 connect the temperature detecting pattern 12 via the connecting lines 122. Furthermore, the portion of connection lines 122 may extend to the predetermined portion of substrate 10' to enhance the connection between the two detecting electrodes 121 and thereof.

Please refer to FIG. 5, the temperature detecting pattern 12 surrounded by an insulation structure of the insulating layer 13 and the auxiliary insulating layer 123 is disposed in a space defined by a conductive substrate 10' as the p-contact electrode 144 of the first embodiment and semiconductor structure 14. Furthermore, the temperature detecting pattern 12 and the insulation structure are located inside the conductive substrate 10', and the conductive substrate 10' contacts the semiconductor structure 14 directly. Thus, the conductive substrate 10' and the auxiliary insulating layer 123 provide a smooth surface in the middle of the semiconductor structure 14. On the other hand, the first electrode provides an approximate planar surface so as to facilitate the subsequent packaging step.

The light emitting diode 1 with the temperature detecting pattern 12 can be packaged as a light emitting device similar to the structure shown in FIG. 4. The light emitting diode 1 is mounted on and received in a package structure 20 and an encapsulating material 22 is provided for covering the light emitting diode 1 so as to protect the light emitting diode 1 and achieve optical effects.

Similarly, the distance of the temperature detecting pattern 12 and the mounting surface of the package structure 2 is smaller than the distance of the active layer 145 of the semiconductor structure 14 and the mounting surface of the package structure 2. In other words, the temperature detecting pattern 12 is located below the semiconductor structure 14

(i.e., the active layer 145) so that the light-emitting area of the semiconductor structure 14 is not influenced by the temperature detecting pattern 12. Therefore, the position and existence of the temperature detecting pattern 12 does not influence the light-emitting area, emitted light intensity and the light-emitting efficiency of the semiconductor structure 14.

In practice, the package structure 20 includes a first conductive structure and a second conductive structure (not shown), wherein each conductive structure has at least two conductive units as positive electrode or negative electrode. The n-contact electrode 142 and the p-contact electrode 144 (i.e., substrate 10') of the semiconductor structure 14 are respectively electrically connected to a cathode and an anode of a power supply via the first conductive structure of the package structure 20 and conductive wires (i.e., first conductive wires). The two detecting electrodes 121 which connect the temperature detecting pattern 12 are connected to the electronic device via the second conductive structure of the package structure 20 and other conductive wires (i.e., second conductive wires). The first conductive wires are independent to the second conductive wires so that the power signal of n-contact electrode 142 and the p-contact electrode 144 are independent to the temperature signal of the two detecting electrodes 121. Please note that the first conductive wires and the second conductive wires are respectively connected to the package structure 20 in FIG. 4, but it is simply an illustrated drawing. Therefore, the temperature detecting pattern 12 can detect the real temperature of PN junction when the light emitting diode 1 is emitting light.

Figure 7:
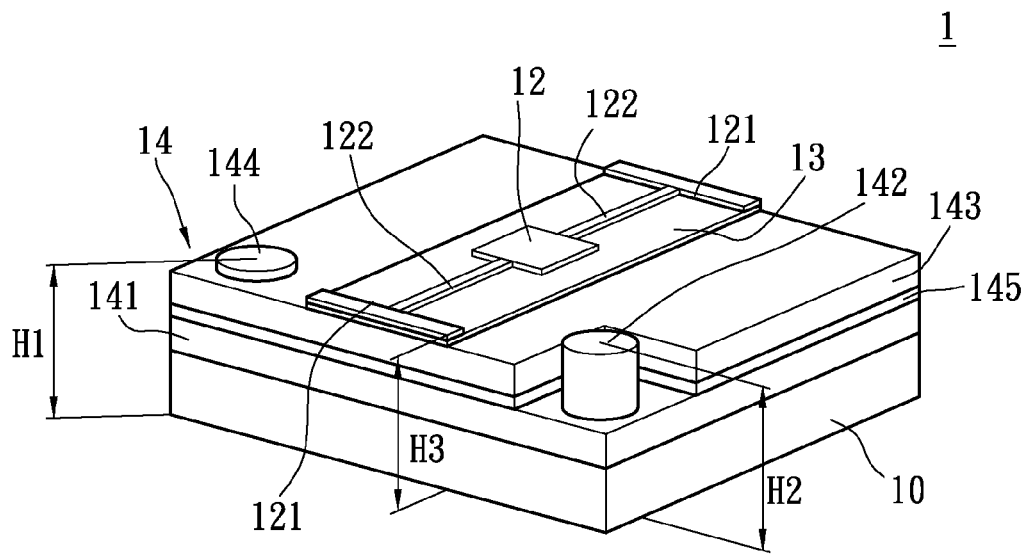
FIG. 7 shows the third embodiment of the light emitting diode according to the present invention.
Figure 8:
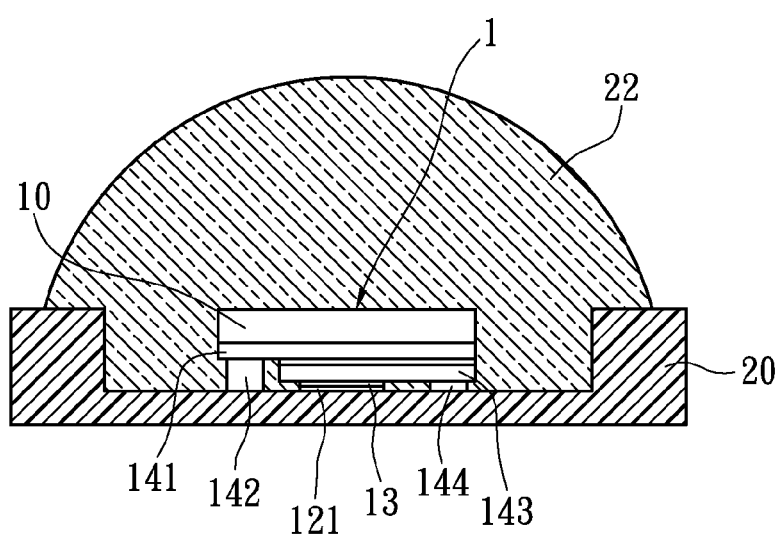
FIG. 8 shows that the light emitting diode being packaged as a flip-chip packaged device according to the present invention.

Please refer to FIGS. 7 and 8; a flip-chip type light emitting diode 1 with a temperature detecting pattern 12 as a circuit is shown. In other words, the light emitting diode 1 is packaged in a flip-chip manner. The light emitting diode 1 is flipped up side down for being packaged as a flip-chip device as shown in FIG. 8. An n-contact electrode 142 and a p-contact electrode 144 are respectively connected to a conductive circuit (structure) on the package structure 20 without the conductive wires. For the reason of illumination efficiency of the light emitting diode 1, it is necessary to dispose the temperature detecting pattern 12 below the active layer 145 of semiconductor structure 14 after having flipped the light emitting diode 1. In other words, the temperature detecting pattern 12 is located above the semiconductor structure 14 in the manufacturing processes of flip chip type light emitting diode 1.

The flip-chip light emitting diode 1 is manufactured by the following steps similarly to the second embodiment. Step 1 is providing a substrate 10. Step 2 is manufacturing a semiconductor structure 14 on the substrate 10. Then, step 3 is forming the temperature detecting pattern 12, a first electrode as the p-contact electrode 144 on the semiconductor structure 14. The temperature detecting pattern 12, the first electrode may be defined by a photolithography process. Furthermore, a second electrode is formed on the n semiconductor 141 as the n-contact electrode 142, wherein the first electrode and the second electrode have similar heights, wherein preferably the two electrodes are positioned in the same horizontal-level. Alternatively, the temperature detecting pattern 12, the first electrode, and the second electrode may be formed by same photolithography process. In addition, a step of forming an insulating layer 13 between the temperature detecting pattern 12 and semiconductor structure 14 is provided. Similarly, the temperature detecting pattern 12 can be a detecting line with a shape of serpentine, waveform, a zigzag, and so on.

Accordingly, the flip-chip light emitting diode 1 includes a substrate 10, a semiconductor structure 14 disposed on the substrate 10, and a temperature detecting pattern 12 disposed on the semiconductor structure 14. The semiconductor structure 14 includes an n-type semiconductor layer 141, an active layer 145, and a p-type semiconductor layer 143. The flip-chip light emitting diode 1 further has an insulating layer 13 disposed between the temperature detecting pattern 12 and the semiconductor structure 14, and has a first electrode (i.e., p-contact electrode 144) and a second electrode (i.e., re-contact electrode 142) on the semiconductor structure 14. The first electrode and the second electrode are respectively connected to the p-type semiconductor layer 143 and n-type semiconductor layer 141.

Moreover, a height H1 calculated form the bottom surface of the substrate 10 to the top of the first electrode is almost the same as a height H2 calculated form the bottom surface of the substrate 10 to the top of the second electrode due to the packaging process. In other words, the first electrode and the second electrode are electrodes having the same height for the flip-chip package. Furthermore, a height H3 calculated form the bottom surface of the substrate 10 to the top of the temperature detecting pattern 12 is the same with the height H1 and the height H2.

Similar to the above-mentioned embodiments, the temperature detecting pattern 12 has detecting electrodes 121 on the two sides of the temperature detecting pattern 12, wherein the temperature detecting pattern 12 connects to the two detecting electrodes 121 respectively via a connection line 122. The two detecting electrodes 121 output the real and precise temperature value to the electronic unit. The temperature detecting pattern 12 includes a serpentine detecting line, a waveform detecting line or a zigzag detecting line.

As shown in FIG. 8, the light emitting diode 1 is reversed and mounted on the package structure 20. Moreover, the encapsulating material 22 is provided for covering the light emitting diode 1 so as to protect the light emitting diode 1 and achieve optical effects. On the other hand, the temperature detecting pattern 12 is located below the semiconductor structure 14 (i.e., the active layer 145) in the reversed light emitting diode 1 so that the light-emitting area of the upper semiconductor structure 14 is not influenced by the temperature detecting pattern 12. Therefore, the position and existence of the temperature detecting pattern 12 does not influence the light-emitting area, emitted light intensity and the light-emitting efficiency of the semiconductor structure 14.

Accordingly, the light emitting diode 1 of the present invention can be applied for various light emitting devices. On the other hand, the temperature detecting pattern 12 is disposed under the semiconductor structure 14 so that the temperature detecting pattern 12 has no influence on the light-projection efficiency. Moreover, the temperature detecting pattern 12 as a circuit can detect the temperature of PN junction of the semiconductor structure 14 and can transmit the temperature signal to an exterior electronic device which can control fans or heat-dissipation devices to cool the light emitting diode 1.

In summary, the present invention has the following advantages.

1. The present invention provides for improved precision for temperature detection of PN junction. Because the temperature detecting pattern is integral with the light emitting diode, the temperature detecting pattern is located much closer to the PN junction. Therefore, the temperature detected by the temperature detecting pattern can represent the real temperature of the PN junction, and so the precision and the stability of the temperature detection are improved. The problem of the imprecise temperature measured by the traditional temperature detecting unit which is assembled with the light emitting diode is solved. The traditional temperature detecting unit that is either assembled inside or outside the package structure both have the same issue, and the issue is that the temperature detecting unit is too away from the PN junction to precisely detect the temperature of PN junction.

2. The temperature detecting pattern can be used to detect the temperature of PN junction in real time. In other words, the temperature of PN junction is detected in real time when the light emitting diode is functioning. Therefore, the temperature of PN junction may be detected for controlling the temperature of a lighting system or for notifying the users by applying the light emitting diode on the lighting system.

3. The temperature detecting pattern such as RTD is formed under the semiconductor structure; therefore the temperature detecting pattern does not influence the light-projection area of the semiconductor structure. Moreover, the material and the processes of the temperature detecting pattern can be integral with the light emitting diode, and the temperature detecting pattern can be used in various kinds of light emitting diode. Thus the temperature detecting pattern can be used for improving the value of applications.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A light emitting device comprising:
a package structure;
a light emitting diode mounted on the package structure, wherein the light emitting diode having a semiconductor structure, a temperature detecting pattern formed between the package structure and the semiconductor structure, and an insulating layer formed between the semiconductor structure and the temperature detecting pattern; and
an encapsulating material provided for covering the light emitting diode so as to protect the light emitting diode and achieve optical effects.

2. The light emitting device according to claim 1, wherein the semiconductor structure has an n-type semiconductor layer, an active layer, a p-type semiconductor layer.

3. The light emitting device according to claim 1, wherein the light emitting diode has two detecting electrodes formed between the package structure and the semiconductor structure, and the two detecting electrodes are insulating from the semiconductor structure and electrically connected to the temperature detecting pattern.

4. The light emitting device according to claim 3, wherein the light emitting diode has a substrate arranged between the package structure and the temperature detecting pattern, and at least one edge of one of the two detecting electrodes is aligned to one lateral edge of the substrate.

5. The light emitting device according to claim 1, wherein the temperature detecting pattern is formed with a serpentine detecting line, a waveform detecting line, or a zigzag detecting line.

6. The light emitting device according to claim 3, wherein the temperature detecting pattern is formed with a detecting line, and wherein the temperature detecting pattern is connected to the two detecting electrodes respectively via a connection line, and a width of the detecting line of the temperature detecting pattern is smaller than a width of each connection line.

7. The light emitting device according to claim 3, wherein the two detecting electrodes are partly exposed from the semiconductor structure.

8. The light emitting device according to claim 7, wherein the light emitting diode has a substrate arranged between the package structure and the temperature detecting pattern, and wherein the semiconductor structure has an n-type semiconductor layer formed on the insulating layer and having an n-contact electrode on the top thereof, a p-type semiconductor layer having a p-contact electrode on the top thereof, and an active layer formed between the n-type semiconductor layer and the p-type semiconductor layer.

9. The light emitting device according to claim 7, wherein the light emitting diode has an auxiliary insulating layer, wherein the temperature detecting pattern is surrounded by the insulating layer and the auxiliary insulating layer.

10. The light emitting device according to claim 9, wherein the light emitting diode has a conductive substrate arranged between the package structure and the semiconductor structure, and wherein the temperature detecting pattern, the insulating layer, the auxiliary insulating layer, and the two detecting electrodes are located in a space formed by the conductive substrate.

11. The light emitting device according to claim 9, wherein the light emitting diode has a conductive substrate arranged between the package structure and the semiconductor structure, the semiconductor structure has a p-type semiconductor layer disposed on the conductive substrate and the insulating layer, an n-type semiconductor layer having an n-contact electrode on the top thereof, and an active layer formed between the n-type semiconductor layer and the p-type semiconductor layer.

12. The light emitting device according to claim 9, wherein the two detecting electrodes are disposed on the auxiliary insulating layer, and at least one edge of each of the two detecting electrodes is aligned to at least one neighboring lateral edge of the substrate.

13. The light emitting device according to claim 1, wherein the semiconductor structure has an n-contact electrode and a p-contact electrode faced and connected to the package structure individually.

14. The light emitting device according to claim 13, wherein the semiconductor structure has an n-type semiconductor layer having an n-contact electrode, a p-type semiconductor layer having a p-contact electrode, and an active layer formed between the n-type semiconductor layer and the p-type semiconductor layer, and wherein the insulating layer is formed between the p-type semiconductor layer and the temperature detecting pattern.

15. The light emitting device according to claim 1, wherein the insulating layer is a ZrN layer, an AlN layer, or a ZrN/AlN layer.

16. The light emitting device according to claim 1, wherein temperature detecting pattern is made of Au, Ni or Au/(Cr, Ni).

17. A light emitting device comprising:
a package structure;
a light emitting diode mounted on the package structure, wherein the light emitting diode has a semiconductor structure, a temperature detecting pattern, and an insulating layer formed between the semiconductor structure and the temperature detecting pattern, and wherein the semiconductor structure has an n-type semiconductor layer, an active layer, and a p-type semiconductor layer; and
an encapsulating material provided for covering the light emitting diode,
wherein the temperature detecting pattern is closer to the surface of the package structure than the active layer of the semiconductor structure.

18. The light emitting device according to claim 17, wherein the light emitting diode has two detecting electrodes formed between the package structure and the semiconductor structure and electrically connected to the temperature detecting pattern, wherein the light emitting diode has a substrate arranged between the package structure and the temperature detecting pattern, and at least one edge of one of the two detecting electrodes is aligned to one lateral edge of the substrate.

19. The light emitting device according to claim 17, wherein the temperature detecting pattern is formed with a serpentine detecting line, a waveform detecting line, or a zigzag detecting line.

20. The light emitting device according to claim 17, wherein the light emitting diode has two detecting electrodes formed between the package structure and the semiconductor structure, wherein the temperature detecting pattern is formed with a detecting line, and wherein the temperature detecting pattern is connected to the two detecting electrodes respectively via a connection line, and a width of the detecting line of the temperature detecting pattern is smaller than a width of each connection line.

* * * * *